Sept. 9, 1969 J. A. MILNES 3,466,549

ELECTRICAL SWITCHING SYSTEM WHICH DEFEATS AUTOMATIC FINE TUNING CONTROL THROUGH ONE SWITCH CONTACT, ACTUATED DURING EITHER MANUAL CHANNEL CHANGE OR MANUAL FINE TUNING

Filed Feb. 29, 1968

Inventor:
JAMES A. MILNES
BY Eugene M. Whitacre
Attorney 3,466,549
Patented Sept. 9, 1969

3,466,549

ELECTRICAL SWITCHING SYSTEM WHICH DEFEATS AUTOMATIC FINE TUNING CONTROL THROUGH ONE SWITCH CONTACT, ACTUATED DURING EITHER MANUAL CHANNEL CHANGE OR MANUAL FINE TUNING

James Allen Milnes, Nashville, Ind., assignor to RCA Corporation, a corporation of Delaware Filed Feb. 29, 1968, Ser. No. 709,348
Int. Cl. H04b *1/06*; H03j *5/02*
U.S. Cl. 325—457 3 Claims

ABSTRACT OF THE DISCLOSURE

An electric switch for defeating an automatic fine tuning control voltage during channel change and fine tuning adjustment includes two contact members, one of which has a follower arm secured thereto. The follower arm rides on the periphery of the detent wheel which, during rotation, forces the contact members into engagement. Means are provided to displace the first contact member, the second contact member and the follower arm to force the follower arm against the detent wheel and thereby force the contact members into engagement.

This invention relates generally to electrical switches and more particularly to an electrical switch adapted to be actuated during channel change and fine tuning adjustment of a television tuner.

In the past, where it has been necessary to defeat an automatic fine tuning (AFT) control voltage during channel change and fine tuning adjustment, two switches have been provided. In such case, one switch is actuated when the television receiver is fine tuned, and the other switch is actuated when the television tuner is changed between channel positions. An example of this is the switching system used on the RCA KRK 131D tuner which is incorporated into the RCA CTC 30 color television chassis.

It is an object of the present invention to provide an improved electrical switch which is actuated during channel change and fine tuning adjustment.

An electrical switching system embodying the present invention is adapted to be utilized with a television system of the type having a television tuner with a rotatable channel selecting shaft. A fine tuning mechanism with a slide member adapted to be displaced relative to the tuner shaft when the fine tuning of the tuner is being adjusted and an automatic fine tuning control circuit are included in the television system.

The electrical switching system includes a switch connected in the automatic fine tuning control circuit and operable when the switch is actuated to disable the automatic fine tuning control of the tuner. A star wheel is mounted for rotation with the channel selector shaft, and the switch is mounted on the slide member in a manner such that the switch is mechanically coupled to the star wheel so that the switch is actuated to disable the automatic fine tuning control of the tuner when the channel selector switch is being rotated. The fine tuning control means is coupled to the slide to move the slide in a direction to fine tune the tuner and to cause the switch to be actuated, again, to disable the fine tuning control of the tuner.

The novel features that are considered characteristic of this invention are set forth with particularity in the appended claims. The invention itself, however, both as to its organization and method of operation, will best be understood from the following description when read in conjunction with the accompanying drawings, in which:

Figures 1, 3:
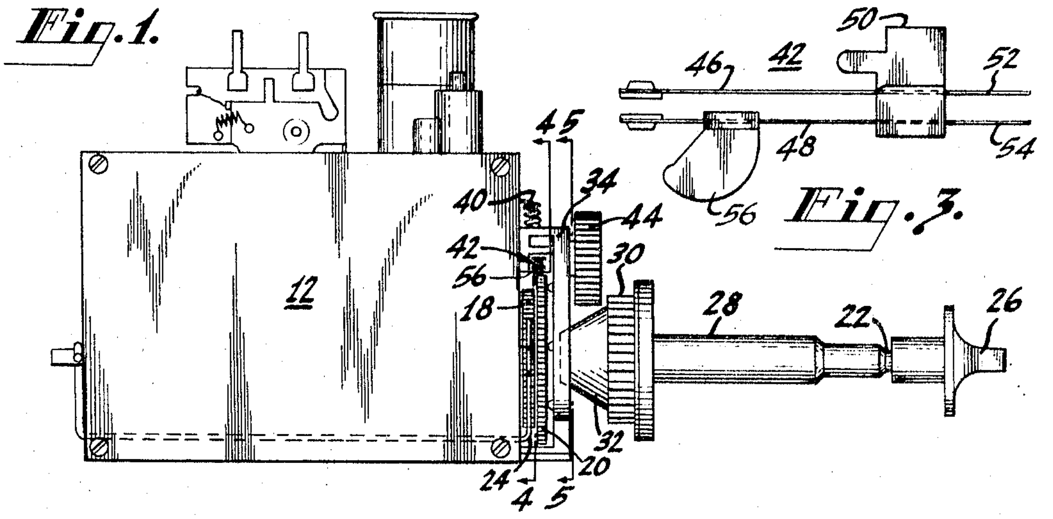
FIGURE 1 is a side view, in elevation, of a television tuner having an electrical switch embodying the present invention.
FIGURE 3 is a side view of the contact portion of the electrical switch.
Figure 2:
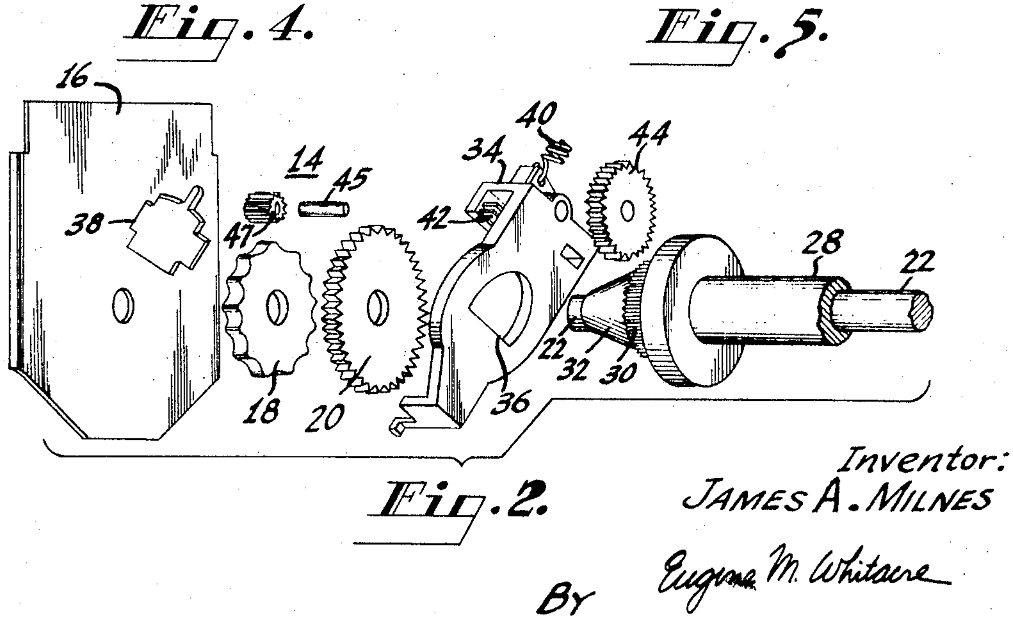
FIGURE 2 is an exploded view of the gear assembly shown in FIGURE 1.

Referring now to FIGURES 1 and 2, a television tuner 12 has a gear assembly 14 mounted on its front plate 16. The gear assembly includes a star wheel 18 and a gear 20 secured on a shaft 22. The gear 20 is adapted to be mechanically connected to a display device, not shown, to indicate the channel to which the tuner is tuned. A tortion spring detent 24 engages the star wheel 18 to cause detent action during channel change. Thus, when the tuner channel selection knob 26 is rotated, the shaft 22 to which it is joined rotates causing the gear 20 and the star wheel 18 to rotate. This rotational motion causes rearrangement of electrical components within the tuner to tune it to a desired channel. The tortion spring detent 24 during this rotational movement rides on the star wheel 18 thereby causing the detent action.

Concentric with the shaft 22 is a fine tuning shaft 28 which includes a gear 30 and a cam surface 32. The fine tuning shaft, which is longitudinally displaced during fine tuning adjustment, passes through an apperture in a slide 34. In its normal position, the bottom of the cam surface 32 rests against the slide flat portion 36 which is part of the apperture in the slide 34. A portion of the slide 34 fits through an opening 38 in the tuner front plate 16 and is resiliently held in place by a spring 40 which is secured to the front plate.

Secured to the slide is an electrical switch 42, shown most clearly in FIGURE 3, and a fine tuning adjustment gear 44. The gear 44 engages with the gear 30 upon axial displacement of the fine tuning shaft 28. That is, the cam surface 32, upon axial displacement towards the tuner front plate 16, forces the slide 34 to displace because of the force on the slide opening flat portion 36. This brings gears 44 and 30 into engagement and allows rotation of the gear 44 by a rotational movement imparted to the fine tuning shaft 28. The gear 44 is secured to a shaft 45 which carries a gear 47 and extends through the opening 38. The gear 47, during fine tuning adjustments, engages a tuning slug pinion, not shown, to position the slug and thereby fine tune the tuner.

The electrical switch 42 includes two leaf contact members 46 and 48 which are spaced apart by an insulative support 50. The leaf contact members pass through the insulative support to provide two extensions 52 and 54 to the leaf contact members. The extensions 52 and 54 are adapted to be electrically contacted to an AFT control circuit such that when the two contact members are forced into engagement, the AFT voltage is no longer applied to the local oscillator of the tuner.

Figure 4:
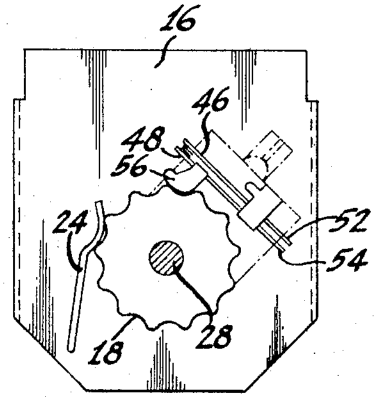
FIGURE 4 is a section view of FIGURE 1 taken along section lines 4—4.
Figure 5:
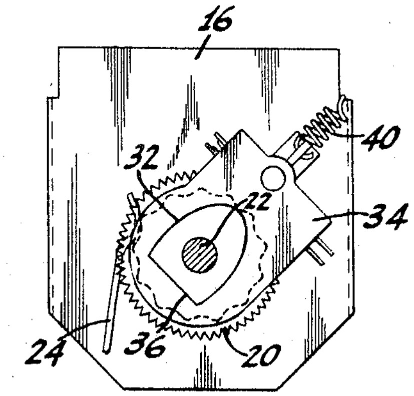
FIGURE 5 is a section view of FIGURE 1 taken along section lines 5—5.

Reference is now made to FIGURE 4. The electrical switch 42 is positioned to ride on the slide 34 in such a manner that the follower arm 56 rides on the periphery of the star wheel 18. In the detented position, the follower arm 56 is positioned between the teeth of the star wheel in the V and the contact members 46 and 48 are in their open position. Consequently, when the tuner channel selection knob 26 is rotated causing the star wheel 18 to rotate the follower arm 56 rides up on the teeth of the star wheel which acts as a cam surface and forces the contact member 48 into engagement with the leaf contact member 46. Thus, during channel change, the leaf contact members are forced into engagement and thereby defeat the AFT. Moreover, when the fine tuning shaft 28 is axially displaced, causing the slide to move diagonally downward as is most clearly shown in FIGURE 5, the electrical switch 42 which is secured to the slide, likewise, moves diagonally downward. At this time, the leaf contacts 46 and 48 are forced into engagement because the V of the star wheel 18, between the teeth, acts as a stop for the follower arm 56 and, hence, the leaf contact 48 such that the displacement of the switch forces the leaf contact 46 into engagement with the leaf contact 48. In this manner, during fine tuning adjustments, the AFT system is defeated.

What is claimed is:

1. In a television system of the type including a television tuner having a rotatable channel selecting shaft, a fine tuning mechanism including a slide member adapted to be displaced relative to said shaft when the fine tuning of said tuner is being adjusted, and further including an automatic fine tuning control circuit for said tuner, the improvement comprising:

a switch connected in said automatic fine tuning control circuit and operable when said switch is actuated to disable the automatic fine tuning control of said tuner;

a star wheel mounted for rotation with said channel selection shaft;

means for mounting said switch on said slide member in a manner such that said switch is mechanically coupled to said star wheel so that said switch is actuated to disable the automatic fine tuning control of said tuner when said channel selector switch is being rotated; and fine tuning control means coupled to said slide to move said slide in a direction to fine tune said tuner and to cause said switch to be actuated to disable the automatic fine tuning control of said tuner.

2. In a television system of the type including a television tuner having a rotatable channel selecting shaft, a fine tuning mechanism including a slide member adapted to be displaced relative to said shaft when the fine tuning of said tuner is being adjusted and further including an automatic fine tuning control circuit for said tuner, the improvement comprising:

a switch connected in said automatic fine tuning control and operable when said switch is actuated to disable the automatic fine tuning control of said tuner a star wheel mounted for rotation with said channel selection shaft;

an insulative follower arm secured to one contact of said switch;

means for mounting said switch on said slide member in a manner such that said follower arm is mechanically coupled to said star wheel so that said switch is actuated to disable the automatic fine tuning control of said tuner when said channel selector switch is being rotated; and fine tuning control means coupled to said slide to move said slide in a direction to fine tune said tuner and to cause said switch to be actuated to disable the fine tuning control of said tuner.

3. An electrical switching system in a television system of the type including an automatic fine tuning control circuit adapted to be disabled by said switching system, the switching system comprising:

a switch connected in said automatic fine tuning control circuit having a first leaf contact and a second leaf contact and operable when said switch is actuated to disable the automatic fine tuning control of said tuner;

a follower arm secured to said second contact member;

a rotatable channel selector shaft having a star wheel secured thereto, the periphery of said star wheel engaging said follower arm and adapted, upon rotation, to actuate said switch; and a longitudinally displaceable television fine tuning control secured concentric with said channel selector shaft and adapted upon longitudinal displacement to actuate said switch.

References Cited

UNITED STATES PATENTS

| | | | |
|---|---|---|---|
| 2,759,371 | 8/1956 | White | 74—568 X |
| 3,194,086 | 7/1965 | Laschenski | 74—568 |
| 3,236,109 | 2/1966 | Stewart et al. | 334—51 X |
| 3,328,700 | 6/1967 | Chipman | 334—53 X |

HERMAN KARL SAALBACH, Primary Examiner

W. H. PUNTER, Assistant Examiner

U.S. Cl. X.R.

74—10.6, 10.8, 527, 568; 200—4; 334—39, 88